US009919915B2

(12) United States Patent
Huang et al.

(10) Patent No.: US 9,919,915 B2
(45) Date of Patent: Mar. 20, 2018

(54) METHOD AND SYSTEM FOR MEMS DEVICES WITH DUAL DAMASCENE FORMED ELECTRODES

(71) Applicant: InvenSense, Inc., San Jose, CA (US)

(72) Inventors: Chunchieh Huang, Fremont, CA (US); Peter Smeys, San Jose, CA (US)

(73) Assignee: INVENSENSE, INC., San Jose, CA (US)

( * ) Notice: Subject to any disclaimer, the term of this patent is extended or adjusted under 35 U.S.C. 154(b) by 20 days.

(21) Appl. No.: 15/182,172

(22) Filed: Jun. 14, 2016

(65) Prior Publication Data
US 2017/0355593 A1 Dec. 14, 2017

(51) Int. Cl.
*H01L 21/768* (2006.01)
*H01L 23/552* (2006.01)
*B81B 7/00* (2006.01)
*B81C 1/00* (2006.01)

(52) U.S. Cl.
CPC .......... *B81B 7/007* (2013.01); *B81C 1/00301* (2013.01)

(58) Field of Classification Search
CPC ............................. B81B 7/007; B81C 1/00301
USPC ....... 438/303, 591, 618, 421, 584, 637, 783, 438/763
See application file for complete search history.

(56) References Cited

U.S. PATENT DOCUMENTS

| | | | | |
|---|---|---|---|---|
| 2004/0038516 A1* | 2/2004 | Kim | ................. | H01L 21/02129 438/624 |
| 2006/0208326 A1* | 9/2006 | Nasiri | ................. | B81C 1/00238 257/414 |
| 2012/0142144 A1* | 6/2012 | Taheri | ..................... | B81B 7/007 438/107 |
| 2012/0147653 A1* | 6/2012 | Chung | .................. | H01L 27/101 365/103 |
| 2015/0364363 A1* | 12/2015 | Wu | ................... | H01L 21/76232 257/777 |

* cited by examiner

*Primary Examiner* — Moin Rahman
(74) *Attorney, Agent, or Firm* — Amin, Turocy & Watson, LLP

(57) ABSTRACT

Methods and systems for MEMS devices with dual damascene formed electrodes is disclosed and may include forming first and second dielectric layers on a semiconductor substrate that includes a conductive layer at least partially covered by the first dielectric layer; removing a portion of the second dielectric layer; forming vias through the second dielectric layer and at least a portion of the second dielectric layer, where the via extends to the conductive layer; forming electrodes by filling the vias and a volume that is the removed portion of the second dielectric layer with a first metal; and coupling a micro-electro-mechanical systems (MEMS) substrate to the semiconductor substrate. A third dielectric layer may be formed between the first and second dielectric layers. A metal pad may be formed on at least one electrode by depositing a second metal on the electrode and removing portions of the second metal, which may be aluminum.

14 Claims, 13 Drawing Sheets

METHOD AND SYSTEM FOR MEMS DEVICES WITH DUAL DAMASCENE FORMED ELECTRODES

CROSS-REFERENCE TO RELATED APPLICATIONS/INCORPORATION BY REFERENCE

N/A

FIELD

Certain embodiments of the disclosure relate to semiconductor devices. More specifically, certain embodiments of the disclosure relate to a method and system for MEMS devices with dual damascene formed electrodes.

BACKGROUND

Micro-electro-mechanical systems (MEMS) devices have become prevalent in electronic devices in applications such as motion sensing, gyroscopes, and microphones, for example. Current MEMS packaging techniques are expensive and complicated.

Further limitations and disadvantages of conventional and traditional approaches will become apparent to one of skill in the art, through comparison of such systems with the present disclosure as set forth in the remainder of the present application with reference to the drawings.

BRIEF SUMMARY

A system and/or method for MEMS devices with dual damascene formed electrodes, substantially as shown in and/or described in connection with at least one of the figures, as set forth more completely in the claims.

Various advantages, aspects and novel features of the present disclosure, as well as details of an illustrated embodiment thereof, will be more fully understood from the following description and drawings.

DETAILED DESCRIPTION

Figure 1:
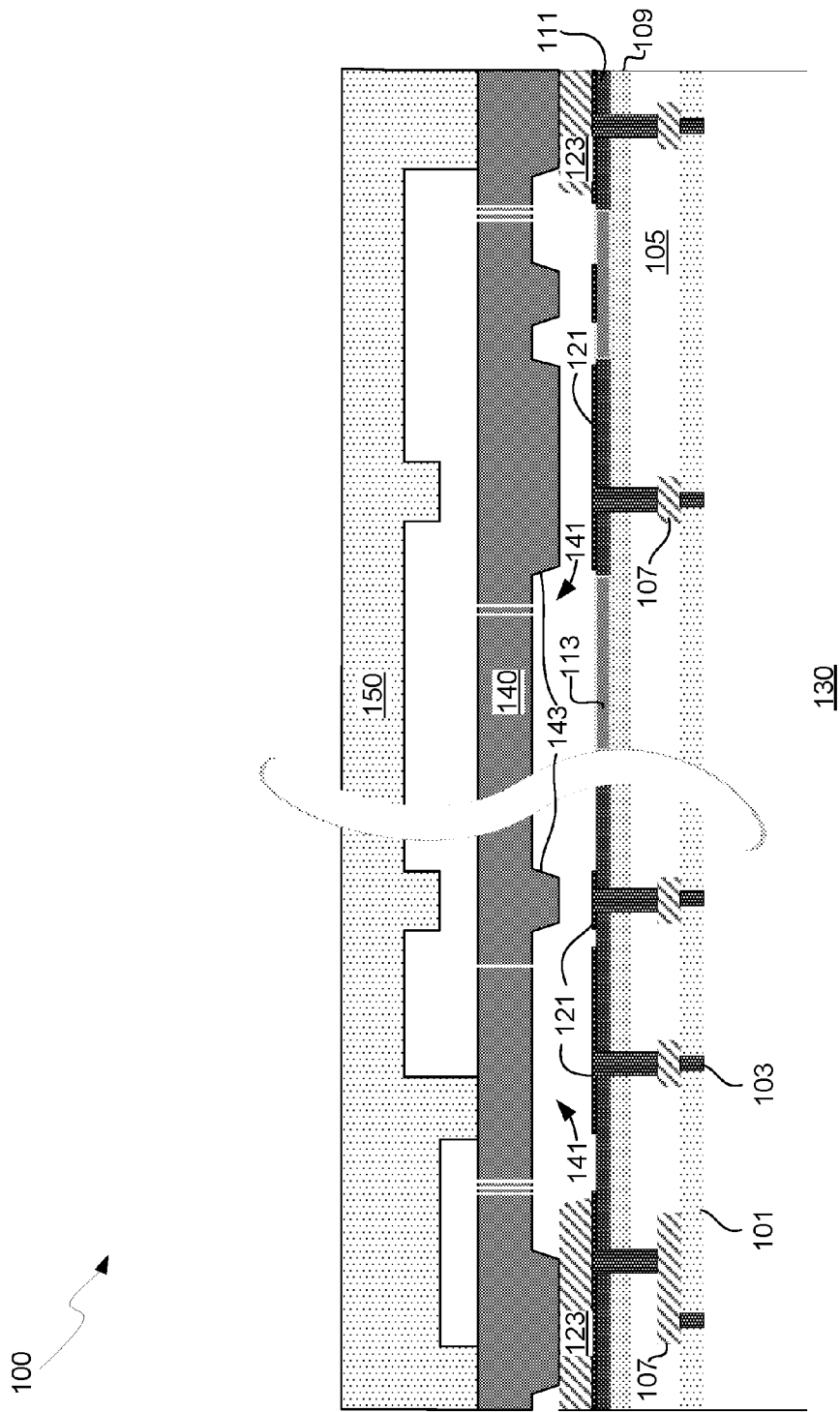
FIG. 1 is a diagram of a MEMS device with dual damascene formed electrodes, in accordance with an example embodiment of the disclosure.

Certain aspects of the disclosure may be found in a method and system for MEMS devices with dual damascene formed electrodes. Exemplary aspects of the disclosure may comprise forming first and second dielectric layers on a semiconductor substrate, where the semiconductor substrate comprises a conductive layer at least partially covered by the first dielectric layer; removing a portion of the second dielectric layer; forming vias through the second dielectric layer and at least a portion of the second dielectric layer, where the via extends to the conductive layer; forming electrodes by filling the vias and a volume comprising the removed portion of the second dielectric layer with a first metal; and coupling a micro-electro-mechanical systems (MEMS) substrate to the semiconductor substrate. A third dielectric layer may be formed between the first and second dielectric layers. A metal pad may be formed on at least one electrode by depositing a second metal on the electrode and removing portions of the second metal, which may comprise aluminum, for example.

The MEMS substrate may be electrically coupled to the semiconductor substrate via the metal pad, the at least one electrode, and the conductive layer. A first gap between the semiconductor substrate and the MEMS substrate may be between a first electrode that does not have a metal pad and a standoff formed in the MEMS substrate. A photoresist layer may be patterned on the second dielectric layer and form a cavity in the first and second dielectric layers exposing the conductive layer, where the cavity is adjacent to at least one of the electrodes. The MEMS substrate may be coupled to the metal layer. A first gap between the semiconductor substrate and the MEMS substrate may be between the exposed conductive layer and the first surface of the MEMS substrate. A second gap between the semiconductor substrate and the MEMS substrate may be between an electrode and the MEMS substrate. A third dielectric layer may be formed between the first and second dielectric layers, and may comprise a high density plasma oxide located lateral to the first metal. The second dielectric layer may comprise a silicon-oxide-nitride material. The first metal, which may comprise tungsten, for example, may be thinned using a chemical-mechanical polishing (CMP) process and may be thinned until first metal is coplanar with a top surface of the second dielectric layer. The second dielectric layer may be removed.

In the described embodiments micro-electro-mechanical systems (MEMS) refers to a class of structures or devices fabricated using semiconductor-like processes and exhibiting mechanical characteristics such as the ability to move or deform. In the described embodiments, the MEMS device may refer to a semiconductor device implemented as a micro-electro-mechanical system. The MEMS structure may refer to any feature that may be part of a larger MEMS device. MEMS devices often, but not always, interact with electrical signals. MEMS devices include but are not limited to gyroscopes, accelerometers, magnetometers, pressure sensors, microphones, and radio-frequency components. Silicon wafers containing MEMS structures are referred to as MEMS wafers.

A structural layer may refer to the silicon layer with moveable structures. An engineered silicon-on-insulator (ESOI) wafer may refer to an SOI wafer with cavities beneath the silicon structural layer. A cap wafer typically refers to a thicker substrate used as a carrier for the thinner silicon device substrate in a silicon-on-insulator wafer.

A MEMS substrate provides mechanical support for the MEMS structure. The MEMS structural layer is attached to the MEMS substrate. The MEMS substrate is also referred to as handle substrate or handle wafer. In some embodiments, the handle substrate serves as a cap to the MEMS structure. Bonding may refer to methods of attaching, and the MEMS substrate and an integrated circuit (IC) substrate may be bonded using a eutectic bond (e.g., AlGe, CuSn, AuSi), fusion bond, compression, thermocompression, adhesive bond (e.g., glue, solder, anodic bonding, glass frit). An integrated circuit (IC) substrate may refer to a semiconductor (e.g., silicon) substrate with electrical circuits, for example CMOS circuits. A package provides electrical connection between bond pads on the chip to a metal lead that can be soldered to a printed board circuit (PCB). A cap or a cover provides mechanical protection to the structural layer and optionally forms a portion of the enclosure. Standoff defines the vertical clearance between the structural layer and the IC substrate.

Standoffs may provide electrical contact between the structural layer and the IC substrate. Standoffs may also provide a seal that defines an enclosure. A cavity may refer to a recess in a substrate. A chip includes at least one substrate typically formed from a semiconductor material. A single chip may be formed from multiple substrates, where the substrates are mechanically bonded together. Multiple chips includes at least two substrates, wherein the two substrates are electrically connected, but do not require mechanical bonding.

FIG. 1 is a diagram of a MEMS device with dual damascene formed electrodes, in accordance with an example embodiment of the disclosure. Referring to FIG. 1, there is shown CMOS-MEMS device 100 comprising CMOS substrate 130, a MEMS substrate 140, and MEMS cover 150. The MEMS substrate 140 may comprise cavities 141 and may be bonded to the MEMS cover 150 with a thin dielectric film (such as silicon oxide, not shown) in between. In some embodiments, the MEMS substrate 140 comprises single crystal silicon or poly crystal silicon, for example. The MEMS substrate 140 may be electrically coupled to the CMOS substrate 130 via the metal pads 123. The portions of the MEMS substrate 140 extending down to the CMOS substrate 130 may comprise standoffs 143.

The CMOS substrate 130 comprises metal pads 123, which may comprise aluminum, for example, although the disclosure is not so limited, as any suitable contact metal may be used, such as gold, silver, aluminum, titanium, tungsten, platinum, and alloys thereof, or similar materials. The metal pads 123 may be formed as described further with respect to FIGS. 2A-2G, and may provide electrical connections between devices in the MEMS substrate 140 and the CMOS substrate 130. The metal pads 123 may be formed on a multi-layer structure on the CMOS substrate 130, which may comprise dielectric layers 101, 105, 109, 111, and 113. Conductive layer 107 may comprise top metals for the CMOS substrate 130 and in an example scenario, may comprise metal that was deposited on the surface of the dielectric layer 101 and the vias 103 and patterned to provide electrical contact to various points on the CMOS substrate 130, thereby providing isolated electrical connectivity to devices and circuits. The vias 103 provide vertical electrical interconnects through the dielectric layer 101 between devices in the CMOS substrate 130 and the metal layer 107.

The dielectric layer 101 may comprise a passivation layer, for example, to protect and electrically isolate devices in the CMOS substrate 130, and may comprise silicon dioxide, silicon nitride, or similar material, for example. Similarly, the dielectric layer 105 is deposited over the dielectric layer 101 and the conductive layer 107. The dielectric layer 105 may comprise silicon dioxide, for example, although other dielectric materials are possible, and may comprise a thicker dielectric layer than the other layers. In addition, the dielectric layer 109 may be on the dielectric layer 105, and may comprise silicon dioxide, for example. The choice of various dielectric layers may be made based on etch selectivity, density, and/or desired dielectric constant, for example.

The dielectric layer 111 may comprise a nitride material, for example, although the disclosure is not so limited, and may provide a surface on which the electrodes 121 are formed. The electrodes 121 may comprise a single metal layer extending from the metal layer 107 to the top surface of the dielectric layer 111.

In an example scenario, a different dielectric material from the dielectric layer 111 may be used for the dielectric layer 113. For example, the dielectric layer 113 may comprise a high density plasma (HDP) oxide layer adjacent to the dielectric layer 111.

Starting from Engineering SOI wafers to form the MEMS substrate 140 shown in FIG. 1, reactive ion etching (RIE) may be utilized to define small protrusions, the standoffs 143 on the MEMS substrate 140, which defines the distance (gap) between the devices in the MEMS substrate 140 and metal pad 123 when the MEMS substrate 140 is bonded to the CMOS substrate 130. The standoffs 143 and the adjacent cavity 141 enable different gap heights between the MEMS substrate 140 and the CMOS substrate 130. A hermetic seal ring which defines the MEMS cavity may also be defined by forming standoffs in a seal ring shape in the MEMS substrate 140.

The MEMS substrate 140 may comprise a structural layer and a device layer, where the structural layer comprises the movable structures and the device layer comprises the electronic devices or functionality for the movable structures. For example, the regions of the MEMS substrate that comprise the standoffs 143 that are not coupled to the CMOS substrate may have freedom to move up and down in response to some mechanical input, such as movement, thereby changing the gap between the standoffs 143 and the electrodes 121, and thus changing the capacitance between them. This change in capacitance may be measured, thereby sensing the mechanical input. The MEMS cover 150 may comprise a protective structure for the MEMS substrate 140, and may also provide a sealed, or hermetic, environment for the MEMS devices in the MEMS substrate 140.

In the CMOS-MEMS device 100, the vertical gap between the electrodes 121 and the MEMS substrate 140 may be defined by the metal pads 123. Furthermore, the design rules for the electrodes 121 and metal pads 123 may be tightened in this example because the electrode patterning is not performed over the topography, but is instead patterned before the electrode metal is deposited in the vias 219 and exposed regions 217.

Figure 2A:
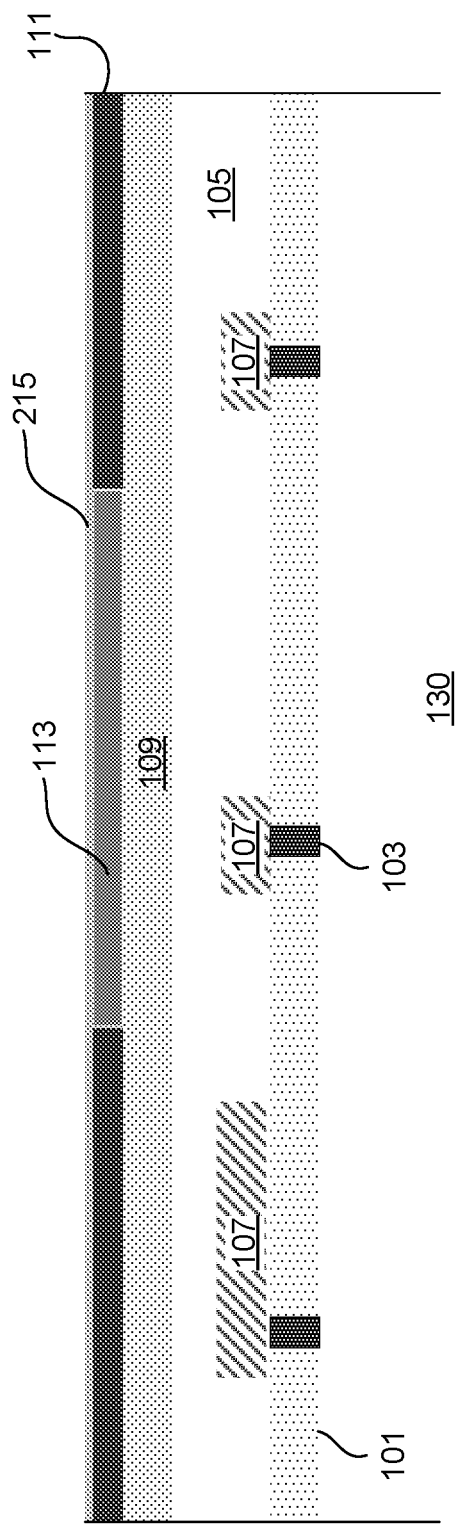
FIGS. 2A-2G illustrate process steps in forming the device of FIG. 1 with dual damascene electrodes, in accordance with an example embodiment of the disclosure.

FIGS. 2A-2G illustrate process steps in forming the device of FIG. 1 with dual damascene electrodes, in accordance with an example embodiment of the disclosure. FIG. 2A illustrates the CMOS substrate 130 with the dielectric layers 101, 105, 109, 111, and 113 as well as the vias 103 and the metal layer 107.

In an example embodiment, a dielectric layer 215 may be deposited on the dielectric layers 111 and 113. The dielectric layer 215 may comprise a silicon oxynitride, for example, although the disclosure is not so limited. The dielectric layer 215 may be utilized to pattern the electrodes, so the material may be chosen to have the desired etch-stop capability when subsequently thinning the formed electrodes. In addition, the thickness of the dielectric layer 215 may be utilized to define a thickness of the electrodes above the dielectric layer 111.

Figure 2B:
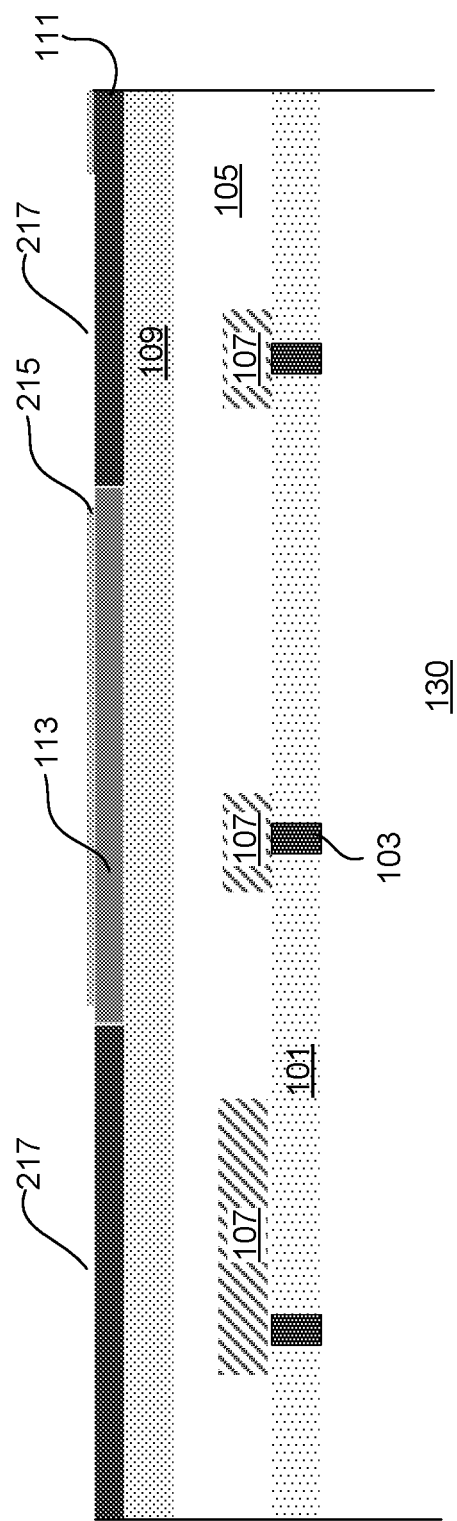

FIG. 2B illustrates the dielectric layer 215 after patterning and etching, which thereby expose regions 217 where the electrodes are to be formed. Therefore, in an example scenario where the dielectric layers 111 and 113 respectively comprise nitride and HDP oxide, a dielectric such as silicon oxynitride may be utilized for the dielectric layer 215 where an etchant that removes silicon oxynitride while leaving the other layers intact is used.

Figure 2C:
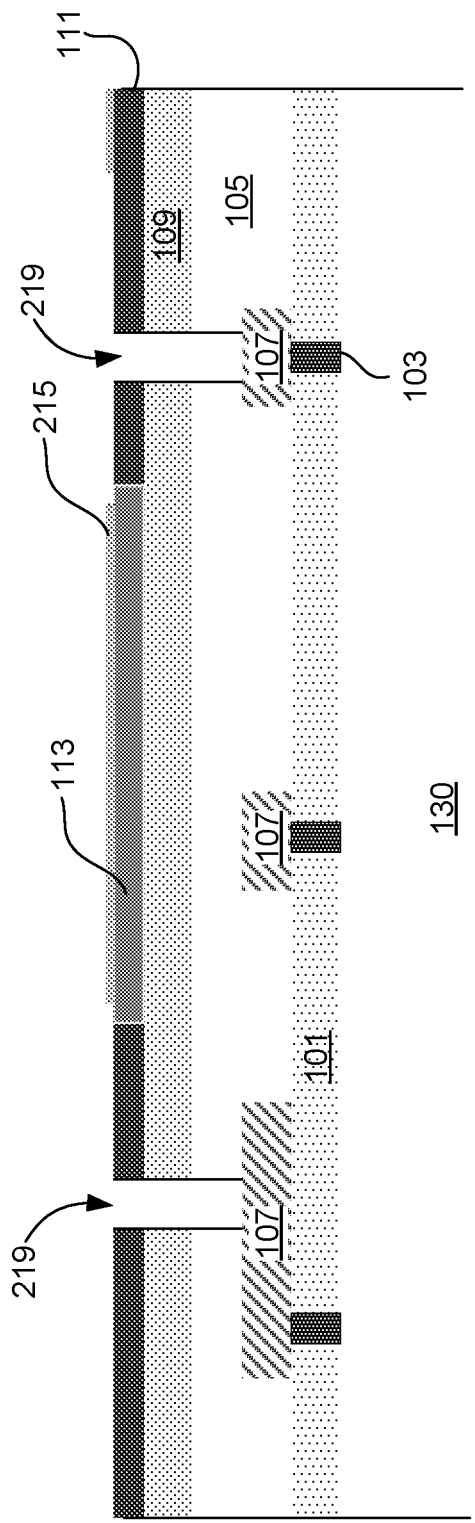

FIG. 2C illustrates the forming of vias 219 in the dielectric layers 105 and 111, where the vias 219 extend down to the metal layer 107. A photolithography process may be utilized to protect the top surface of the dielectric layers 111, 113, and 215 except where the vias are to be formed, after which the photoresist may be removed, resulting in the structure shown in FIG. 2C.

Figure 2D:
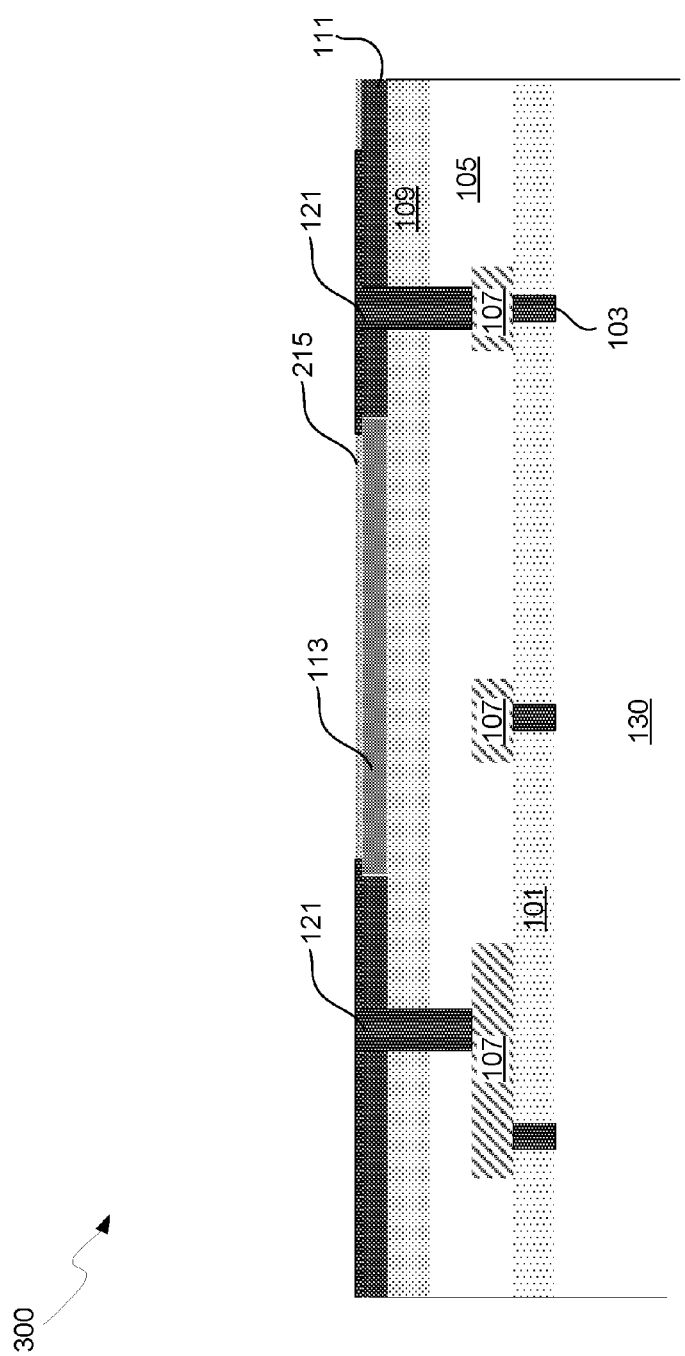

FIG. 2D illustrates the forming of the dual damascene electrodes, where a single metal layer is formed in the vias 219 and on the exposed top surface of the dielectric layers 111 and 113. In an example scenario, the metal may be formed to be thicker than the dielectric layer 215 but then thinned with a chemical-mechanical polish (CMP) process down to the thickness of the dielectric layer 215, demonstrating how this layer may be utilized to define the electrode thickness adjacent to the vias 219. The metal for the electrodes 121 may comprise tungsten, for example, but other metals may be used depending on, for example, the desired work function, mechanical strength, and/or conductivity. For example, other metals may comprise, but are not limited to, Titanium (TI), Tantalum (Ta), and copper (Cu).

The thickness of the metal as deposited may be thicker than, or extend above, the dielectric layer 215, and then may be thinned back using a CMP process to be coplanar with the top of the dielectric layer 215.

Figure 2E:
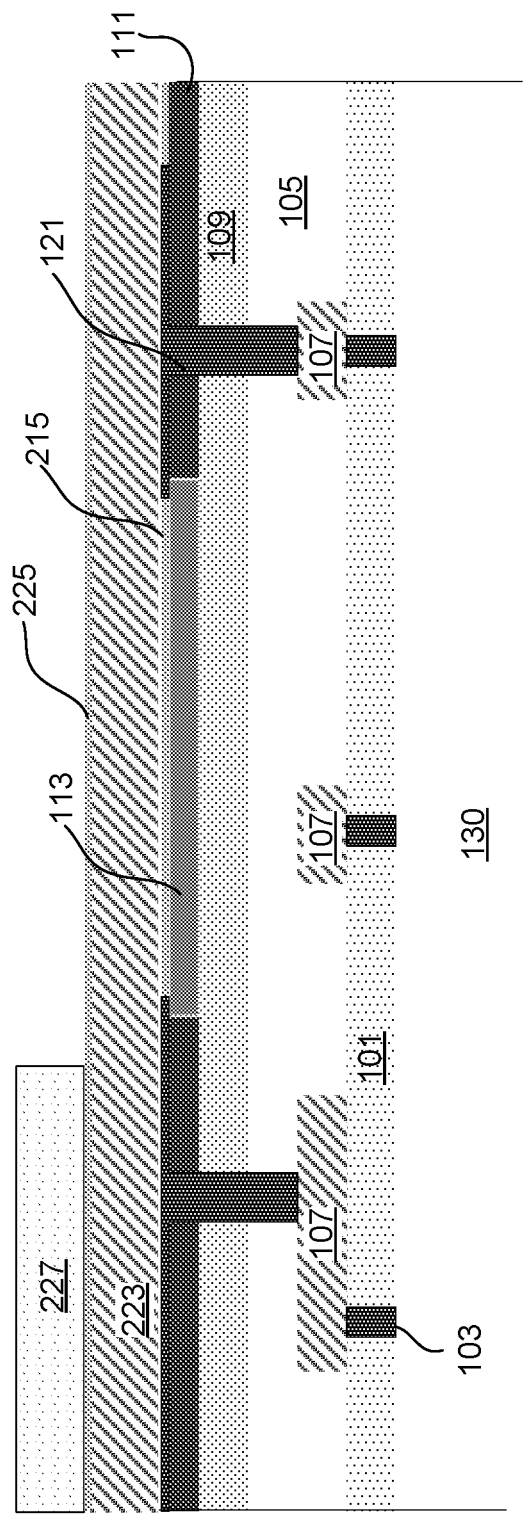

FIG. 2E illustrates the process for forming metal pads 123 on the electrodes, where dielectric layer 225 and a metal layer 223 may be deposited on the top surface of the electrodes 121 and the dielectric layer 215. The dielectric layer 225 may comprise a silicon oxynitride, for example, and the metal layer may comprise aluminum, for example, although the disclosure is not so limited as other dielectrics or metals may be used.

A photoresist layer may be deposited on the dielectric layer 225 and the metal layer 223 and the photoresist subsequently patterned to result in the PR mask 227, thereby covering regions of the dielectric layer 225 and metal layer 223 to protect them from the subsequent etch processes above one or more of the electrodes 121.

Figure 2F:
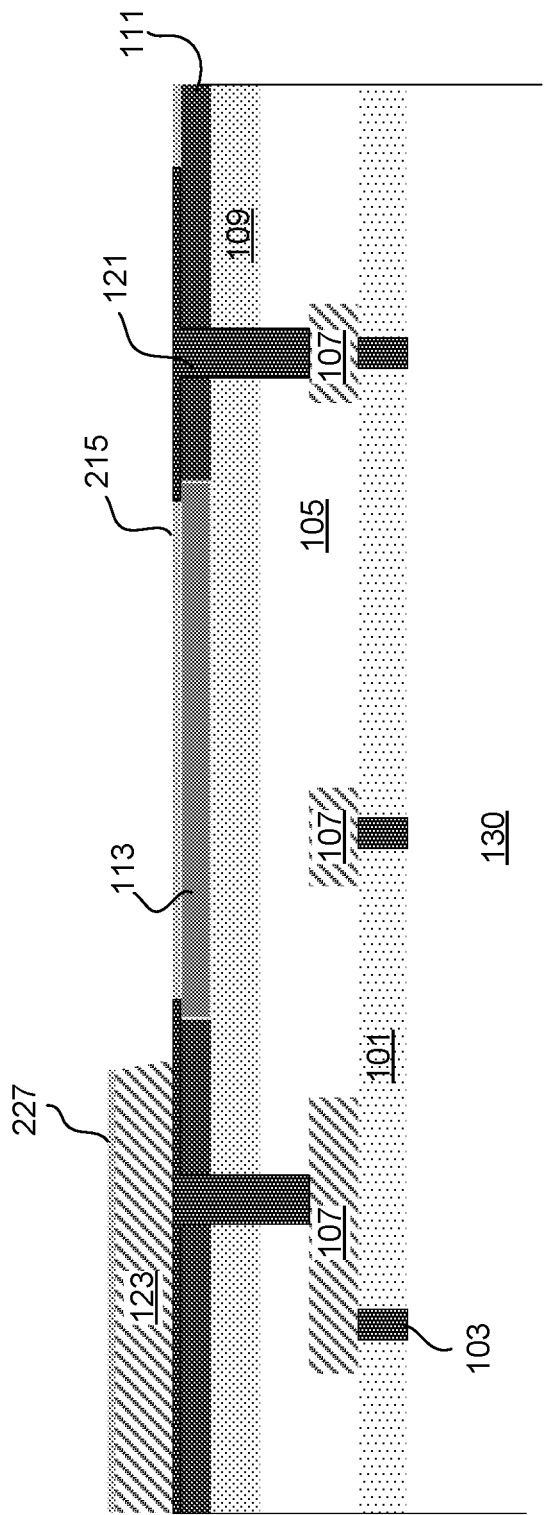

A first etch process may be utilized to remove the exposed portion of the dielectric layer 225 and a second etch process may be utilized to remove exposed portions of the metal layer 223, followed by the removal of the PR mask 227, resulting in the structure shown in FIG. 2F where a portion of the dielectric layer 225 remains. The metal layer 223, the remaining portion of the dielectric layer 222, and the dielectric layer 215 may then be removed, such as by wet chemical or dry etching, for example, resulting in the metal pads 123 of FIG. 2G. A forming gas process may be utilized to anneal the remaining metal.

Figure 2G:
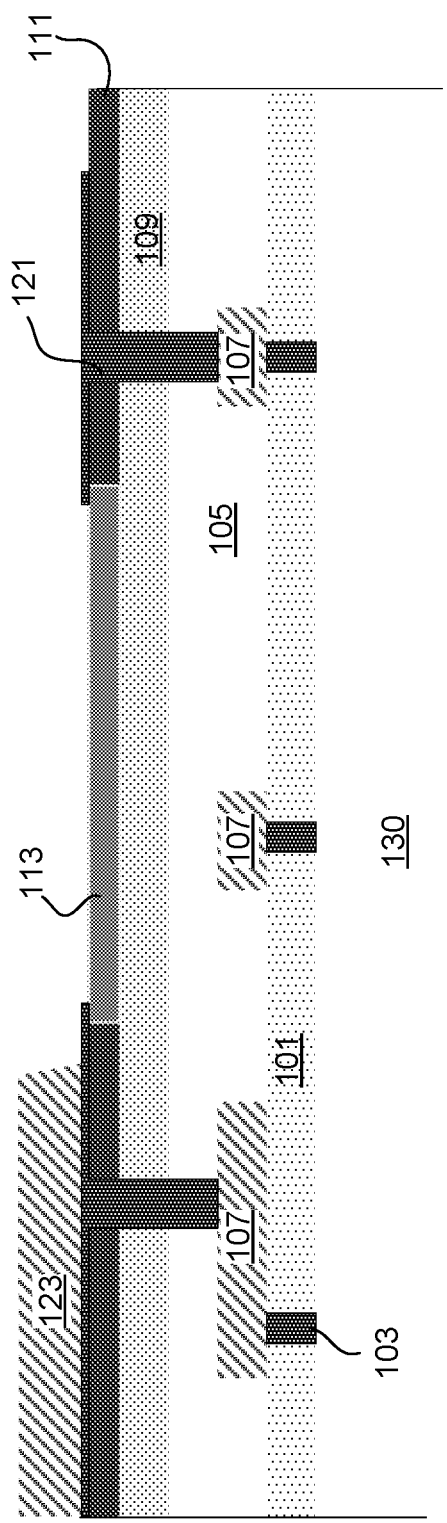

The structure shown in FIG. 2G represents the CMOS substrate 130 with the metal pads 123 and dual damascene electrodes 121 that may then be bonded to a MEMS substrate resulting in the structure of FIG. 1.

Figure 3:
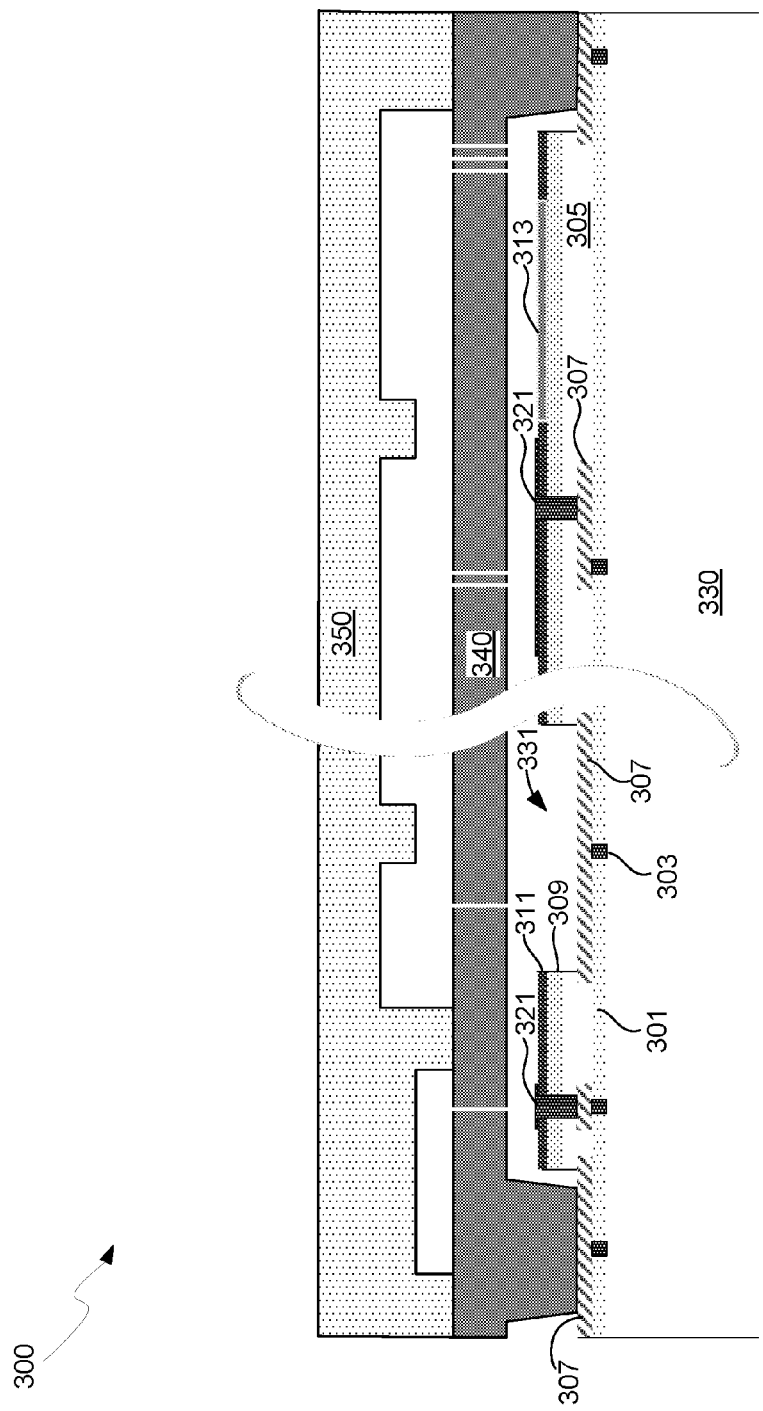
FIG. 3 illustrates another example embodiment of a MEMS device with dual damascene formed electrodes, in accordance with an example embodiment of the disclosure.

FIG. 3 illustrates another example embodiment of a MEMS device with dual damascene formed electrodes, in accordance with an example embodiment of the disclosure. Referring to FIG. 3, there is shown CMOS-MEMS device 300 comprising CMOS substrate 330, MEMS substrate 340, and MEMS cover 350. The MEMS substrate 340 may be bonded to the MEMS cover 350 with a thin dielectric film (such as silicon oxide, not shown) in between. In some embodiments, the MEMS substrate 340 comprises single crystal silicon or poly crystal silicon, for example. The MEMS substrate 340 may be electrically coupled to the CMOS substrate 330 via the metal layer 307.

The CMOS substrate 330 comprises a multi-layer structure, which may comprise dielectric layers 301, 305, 309, 311, and 313. Conductive layer 307 may comprise top metals for the CMOS substrate 330 and in an example scenario, may comprise metal that was deposited on the surface of the dielectric layer 301 and the vias 303 and patterned to provide electrical contact to various points on the CMOS substrate 330, thereby providing isolated electrical connectivity to devices and circuits. The vias 303 provide vertical electrical interconnects through the dielectric layer 301 between devices in the CMOS substrate 330 and the metal layer 307.

The dielectric layer 301 may comprise a passivation layer, for example, to protect and electrically isolate devices in the CMOS substrate 330, and may comprise silicon dioxide, silicon nitride, or similar material, for example. Similarly, the dielectric layer 305 is deposited over the dielectric layer 301 and the conductive layer 307. The dielectric layer 305 may comprise silicon dioxide, for example, although other dielectric materials are possible, and may comprise a thicker dielectric layer than the other layers. In addition, the dielectric layer 309 may be on the dielectric layer 305, and may comprise silicon dioxide, for example. The choice of various dielectric layers may be made based on, for example, etch selectivity, density, and/or desired dielectric constant.

The dielectric layer 311 may comprise a nitride material, for example, although the disclosure is not so limited, and may provide a surface on which the electrodes 321 are formed. The electrodes 321 may comprise a single metal layer formed in a dual damascene process extending from the metal layer 307 to the top surface of the dielectric layer 311.

In an example scenario, a different dielectric material from the dielectric layer 311 may be used for the dielectric layer 313. For example, the dielectric layer 313 may comprise a high density plasma (HDP) oxide layer adjacent to the dielectric layer 311.

The example embodiment shown in FIG. 3 may be similar to that shown in FIG. 1 with the dual damascene electrodes 321, but with the gaps between electrodes 321 and the MEMS substrate 340 being configured by the CMOS substrate 330 as opposed to the MEMS substrate, as illustrated in FIG. 1.

For example, a wider gap between the CMOS substrate 330 and the MEMS substrate 340 is enabled by the cavity 331 formed in the CMOS substrate 330 and a narrower gap results from the distance between the electrodes 321 and the MEMS substrate 340, whereas in FIG. 1, narrower gaps are provided by the standoffs 143 in the MEMS substrate 140 and wide gaps are in regions where there are no standoffs 143.

The MEMS substrate 340 may comprise a structural layer and a device layer, where the structural layer comprises the movable structures and the device layer comprises the electronic devices or functionality for the movable structures. The MEMS cover 350 may comprise a protective structure for the MEMS substrate 340, and may also provide a sealed, or hermetic, environment for the MEMS devices in the MEMS substrate 340.

Figure 4A:
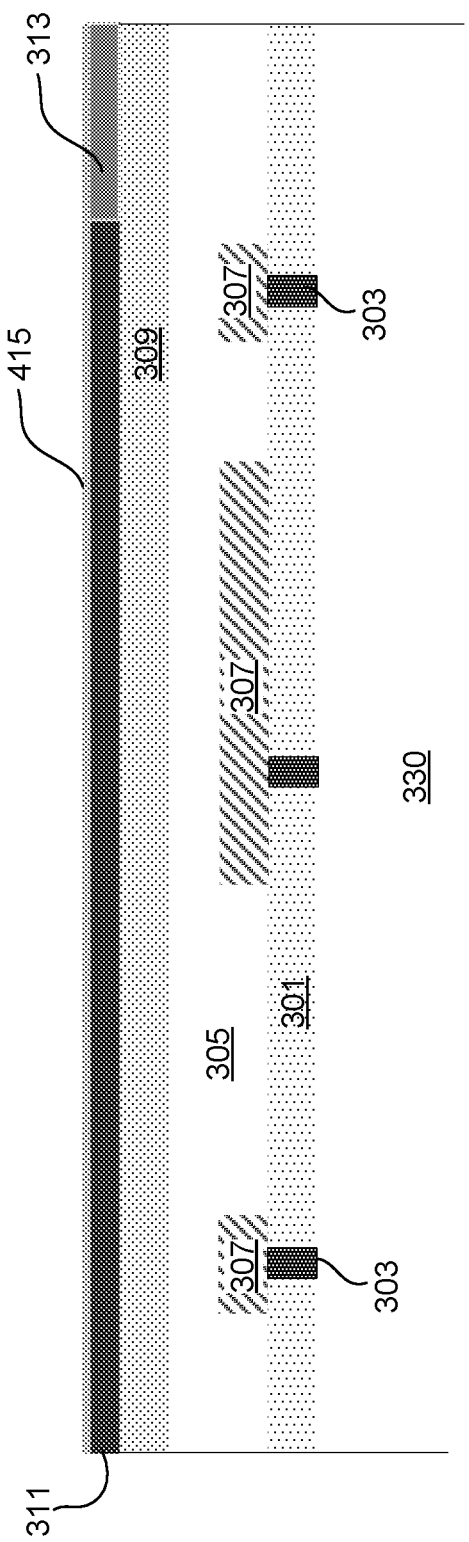
FIGS. 4A-4D illustrate process steps in forming the device of FIG. 3 with dual damascene electrodes, in accordance with an example embodiment of the disclosure.

FIGS. 4A-4D illustrate process steps in forming the device of FIG. 3 with dual damascene electrodes, in accordance with an example embodiment of the disclosure. FIG. 4A illustrates the CMOS substrate 330 with the dielectric layers 301, 305, 309, 311, and 313 as well as the vias 303 and the metal layer 307.

In an example embodiment, a dielectric layer 415 may be deposited on the dielectric layers 311 and 313. The dielectric layer 415 may comprise a silicon oxynitride, for example, although the disclosure is not so limited. The dielectric layer 415 may be utilized to pattern the dual damascene electrodes, so the material may be chosen to have the desired etch-stop capability when the formed electrodes are subsequently thinned. In addition, the thickness of the dielectric layer 415 may be utilized to define a thickness of the electrodes above the dielectric layer 311.

Figure 4B:
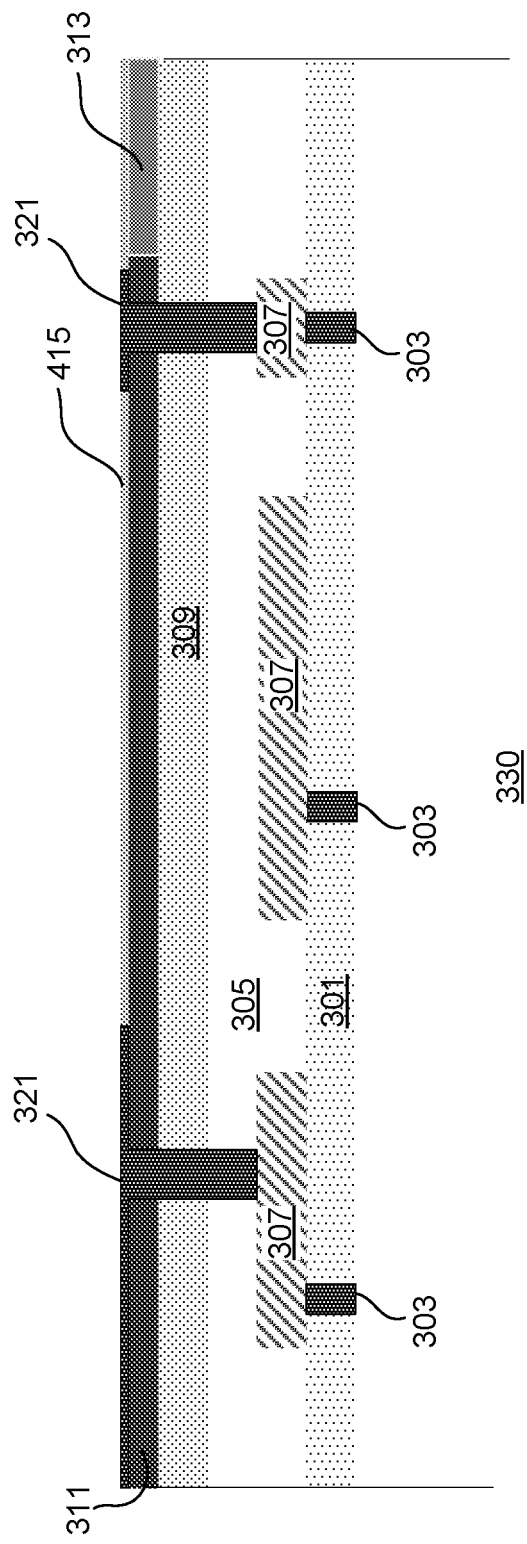

FIG. 4B illustrates the resulting structure after trench patterning the dielectric layer 415, etching vias in the dielectric layers 305 and 311 that extend down to the metal layer 107, and forming of the dual damascene electrodes. The electrodes may be formed by applying a single metal layer in the vias and on the exposed top surface of the dielectric layer 311. In an example scenario, the metal may be formed to be thicker than the dielectric layer 415 but then thinned with a chemical-mechanical polish (CMP) process down to the thickness of the dielectric layer 415, demonstrating how this layer may be utilized to define the electrode thickness adjacent to the vias. The metal for the electrodes 321 may comprise tungsten, for example, but other metals may be used depending on the desired work function, mechanical strength, and/or conductivity.

The thickness of the metal as deposited may be thicker than, or extend above, the dielectric layer 415, and then may be thinned back using a CMP process to be coplanar with the top of the dielectric layer 415.

Figure 4C:
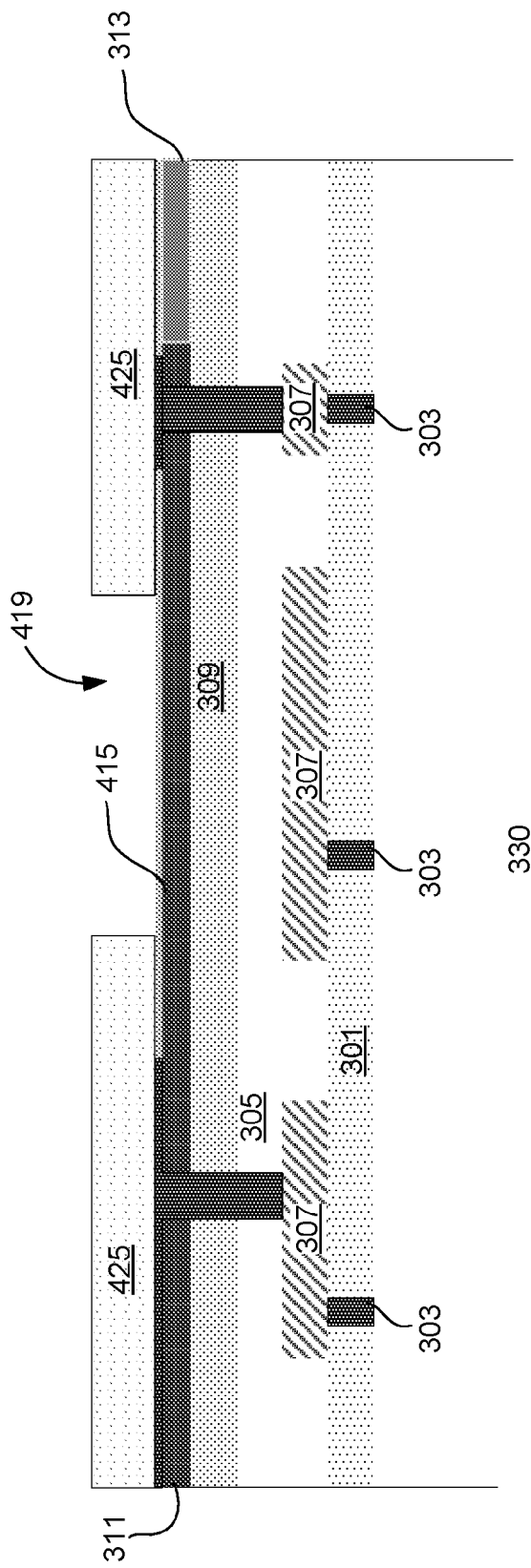

FIG. 4C illustrates the process for forming cavity 331, where a photoresist layer may be deposited on the electrodes 321 and the dielectric layer 415 and subsequently patterned to result in the PR mask 425, thereby covering the electrodes 321 and a portion of the dielectric layer 415 to protect them from the subsequent etch processes while exposing a region 419 for the cavity 331.

Figure 4D:
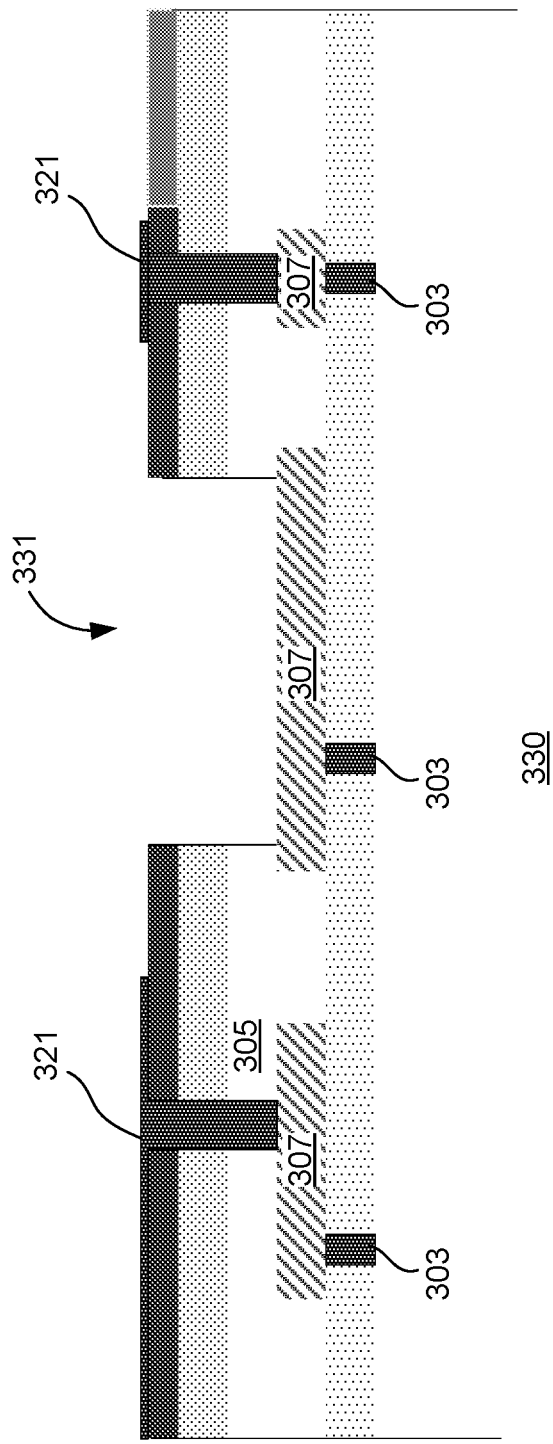

One or more etch processes may be utilized to remove the exposed portion of the dielectric layers 415, 311, 309, and 305 in the exposed region 419, followed by the removal of the PR mask 425 and the remaining dielectric layer 415, resulting in the structure shown in FIG. 4D.

The structure shown in FIG. 4D represents the CMOS substrate 330 with cavity 331 for wider gap separation between the CMOS substrate 330 and the MEMS substrate 340, and the dual damascene electrodes 321 exhibit narrower gap separation when bonded to the MEMS substrate 340.

In an example embodiment, a system is disclosed for MEMS devices with dual damascene formed electrodes. In this regard, aspects of the disclosure may comprise a complementary metal oxide semiconductor (CMOS) substrate comprising: a conductive layer; a first dielectric layer covering at least a portion of the conductive layer; a second dielectric layer above the first dielectric layer; a dual damascene electrode comprising a single metal layer on a top surface of the second dielectric layer and extending through the second dielectric layer and a portion of the first dielectric layer to the conductive layer; and a metal pad above the second dielectric layer. A MEMS substrate may be coupled to the CMOS substrate via the metal pad, where the MEMS substrate comprises standoffs extending from a first surface of the MEMS substrate. A MEMS cover may be coupled to a second surface of the MEMS substrate opposite to the first surface. A metal pad may be on at least one electrode and the MEMS substrate may be electrically coupled to the CMOS substrate via the metal pad, the at least one electrode, and the conductive layer.

In another example embodiment, a system is disclosed for MEMS devices with dual damascene formed electrodes. In this regard, aspects of the disclosure may comprise a complementary metal oxide semiconductor (CMOS) substrate comprising: a conductive layer; a first dielectric layer covering at least a portion of the conductive layer; a second dielectric layer above the first dielectric layer; a dual damascene electrode comprising a single metal layer on a top surface of the second dielectric layer and extending through the second dielectric layer and a portion of the first dielectric layer to the conductive layer; and a cavity in the first and second dielectric layers extending to the conductive layer. A MEMS substrate may be coupled to the CMOS substrate via the conductive layer and a MEMS cover may be coupled to the MEMS substrate on a surface opposite to a surface of the MEMS substrate coupled to the CMOS substrate. The MEMS substrate may be electrically coupled to the metal layer.

As utilized herein the terms "circuits" and "circuitry" refer to physical electronic components (i.e. hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code. As utilized herein, "and/or" means any one or more of the items in the list joined by "and/or". As an example, "x and/or y" means any element of the three-element set {(x), (y), (x, y)}. In other words, "x and/or y" means "one or both of x and y". As another example, "x, y, and/or z" means any element of the seven-element set {(x), (y), (z), (x, y), (x, z), (y, z), (x, y, z)}. In other words, "x, y and/or z" means "one or more of x, y and z". As utilized herein, the term "exemplary" means serving as a non-limiting example, instance, or illustration. As utilized herein, the terms "e.g.," and "for example" set off lists of one or more non-limiting examples, instances, or illustrations. As utilized herein, circuitry or a device is "operable" to perform a function whenever the circuitry or device comprises the necessary hardware and code (if any is necessary) to perform the function, regardless of whether performance of the function is disabled or not enabled (e.g., by a user-configurable setting, factory trim, etc.).

While the disclosure has been described with reference to certain embodiments, it will be understood by those skilled in the art that various changes may be made and equivalents may be substituted without departing from the scope of the present disclosure. In addition, many modifications may be made to adapt a particular situation or material to the teachings of the present disclosure without departing from its scope. Therefore, it is intended that the present disclosure not be limited to the particular embodiments disclosed, but that the present disclosure will include all embodiments falling within the scope of the appended claims.

What is claimed is:
1. A manufacturing method, the method comprising:
   forming first and second dielectric layers on a semiconductor substrate, said semiconductor substrate comprising a conductive layer at least partially covered by the first dielectric layer;
   removing a defined portion of the second dielectric layer;
   forming vias through the second dielectric layer, said via extending to the conductive layer, wherein the vias provide electrical interconnections through the second dielectric layer between devices in the semiconductor substrate and the conductive layer;

forming electrodes by filling the vias, and the defined portion of the second dielectric layer, with a first metal; and coupling a micro-electro-mechanical systems (MEMS) substrate to the semiconductor substrate;

forming a metal pad on the at least one electrode by depositing a second metal on the at least one electrode and removing portions of the second metal, wherein a first gap between the semiconductor substrate and the MEMS substrate is between a first electrode that does not have the metal pad and a standoff formed in the MEMS substrate.

2. The method according to claim 1, comprising forming a third dielectric layer between the first and second dielectric layers.

3. The method according to claim 1, wherein the second metal comprises aluminum.

4. The method according to claim 1, comprising electrically coupling the MEMS substrate to the semiconductor substrate via the metal pad, the at least one electrode, and the conductive layer.

5. The method according to claim 1, comprising patterning a photoresist layer on the second dielectric layer and forming a cavity in the first and second dielectric layers exposing the conductive layer, said cavity adjacent to at least one of the electrodes.

6. The method according to claim 5, comprising coupling the MEMS substrate to the first metal layer.

7. The method according to claim 5, wherein a first gap between the semiconductor substrate and the MEMS substrate is between the exposed conductive layer and a first surface of the MEMS substrate.

8. The method according to claim 5, wherein a second gap between the semiconductor substrate and the MEMS substrate is between the at least one electrode and the MEMS substrate.

9. The method according to claim 1, wherein a third dielectric layer between the first and second dielectric layers comprises a high density plasma oxide located lateral to the first metal.

10. The method according to claim 1, wherein the second dielectric layer comprises a silicon-oxide-nitride material.

11. The method according to claim 1, comprising thinning the first metal using a chemical-mechanical polishing (CMP) process.

12. The method according to claim 11, comprising thinning the first metal using the CMP process stops until first metal is coplanar with a top surface of the second dielectric layer.

13. The method according to claim 1, comprising removing the second dielectric layer.

14. The method according to claim 1, wherein the first metal comprises tungsten.

* * * * *